United States Patent
Ito et al.

(10) Patent No.: US 6,359,679 B1
(45) Date of Patent: Mar. 19, 2002

(54) POSITIONING DEVICE, EXPOSURE DEVICE, AND DEVICE MANUFACTURING METHOD

(75) Inventors: Hirohito Ito, Funabashi; Kotaro Akutsu, Soka, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/480,180

(22) Filed: Jan. 10, 2000

(30) Foreign Application Priority Data

Jan. 11, 1999 (JP) ............................................ 11-004069

(51) Int. Cl.[7] ..................... G03B 27/62; G03B 27/58; G03B 27/42
(52) U.S. Cl. ........................ 355/75; 355/53; 355/72
(58) Field of Search ........................... 355/53, 72–76, 355/77; 310/12, 10; 318/625–628, 632

(56) References Cited

U.S. PATENT DOCUMENTS

| | | | | |
|---|---|---|---|---|
| 5,208,497 A | * | 5/1993 | Ishii et al. ........................ 310/12 |
| 5,511,930 A | * | 4/1996 | Sato et al. ....................... 414/676 |
| 5,815,246 A |   | 9/1998 | Sperling et al. ................... 355/53 |
| 5,909,272 A |   | 6/1999 | Osanai et al. .................... 355/53 |
| 5,917,580 A | * | 6/1999 | Ebinuma et al. .................. 355/53 |
| 5,939,852 A |   | 8/1999 | Akutsu et al. .................... 318/640 |
| 5,959,427 A | * | 9/1999 | Watson ............................ 318/687 |
| 5,982,128 A | * | 11/1999 | Lee ............................ 318/568.16 |
| 6,008,882 A |   | 12/1999 | Ito et al. ......................... 355/53 |
| 6,028,376 A | * | 2/2000 | Osanai ............................ 310/12 |

* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

A positioning device includes a stage which is movable along a reference surface, a stage driving mechanism for driving the stage, and an inertia imparting mechanism for reducing a reaction force produced by driving the stage. The inertia imparting mechanism has a mass body, which is movable with respect to a stage base or a structure, and a mass body driving mechanism for driving the mass body, and the stage base or structure is given inertia by driving the mass body. The inertia imparting mechanism also includes a reaction force compensation, which, by moving the mass body, reduces reaction force caused by motion of the stage, and a positioning compensation control system, which compensates for the position of the mass body. Thus, it is possible to reduce a reaction force produced by motion of the stage, and to compensate for position offset of the mass body.

48 Claims, 16 Drawing Sheets

FIG. 7
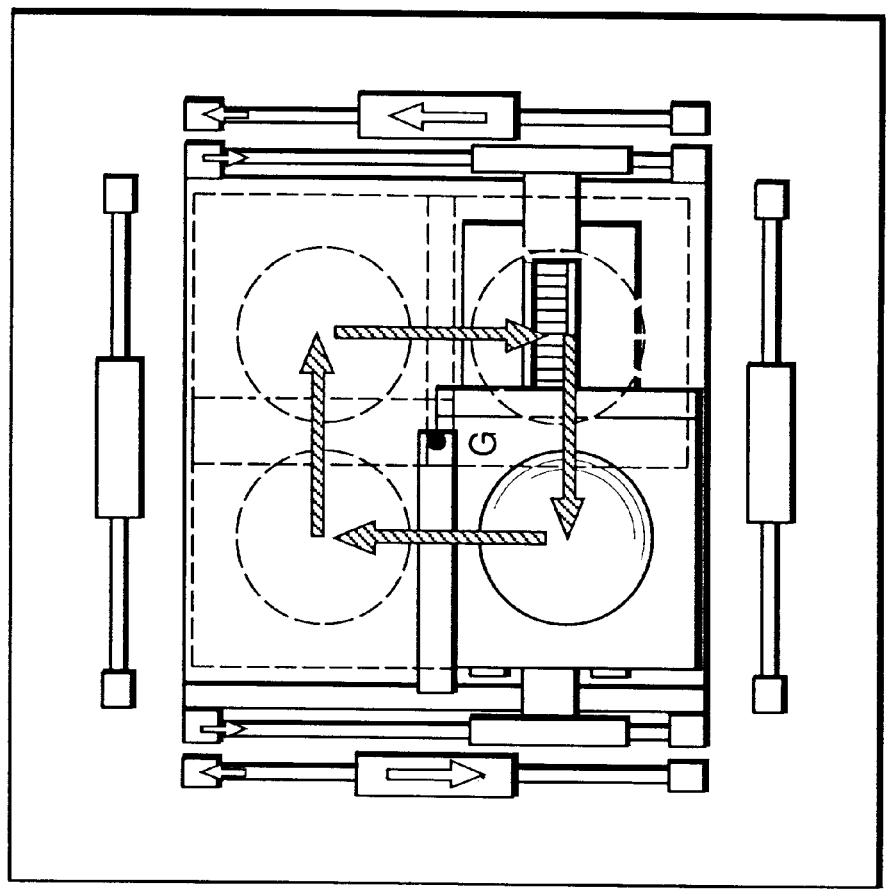
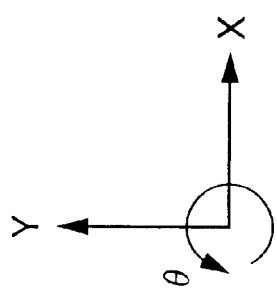

POSITIONING DEVICE, EXPOSURE DEVICE, AND DEVICE MANUFACTURING METHOD

BACKGROUND OF THE INVENTION

The present invention relates to a positioning device suitable for use in positioning various precision processing devices and precision measurement devices, to an exposure device using said positioning device, for use in a lithography step in semiconductor manufacturing, and to a method of manufacturing said device.

Devices conventionally used as exposure devices in manufacturing semiconductor elements include a device called a stepper and a device called a scanner. In a stepper, a semiconductor wafer on a stage device is moved by steps under a projecting lens, while a pattern image formed on a reticle is reduced and projected onto the wafer by the projecting lens so as to successively expose a plurality of positions on a single wafer. In a scanner, a semiconductor wafer on a wafer stage and a reticle on a reticle stage are moved relative to a projecting lens, and, by illumination by a slit-shaped exposure light during the scanning motion, the reticle pattern is projected onto the wafer. The stepper and scanner are, from the point of view of performance (resolution, precision of superimposition, etc.), the most favored exposure devices.

With regard to the semiconductor wafers processed by this type of exposure device, there is a trend toward using large-aperture, large-size semiconductor wafers, in the interests of increasing semiconductor element surface area and reducing costs. Further, there are needs for higher integration of semiconductor elements, high-speed and high-precision stage positioning, and higher through-put.

However, with conventional exposure devices, when increasing semiconductor wafer aperture size by moving the stage at high speed and with high precision, it is necessary to improve the motion characteristics of the stage. For this reason, it becomes necessary to improve guide rigidity, and the weight of the stage must be increased even more than the weight increase due to mere lengthening of the stroke. Moreover, aiming for higher through-put by attempting to increase stage motion acceleration and motion speed to reduce motion time causes further increase of excitation force due to stage motion acceleration. Consequently, the reaction force of driving the stage causes disturbance vibration to be transmitted to the exterior of the stage, which is likely to impair high-speed and high-precision positioning.

In view of these problems, stage devices provided with mass bodies, like that shown in FIG. 16, have been proposed.

In FIG. 16, 101 is an X stage for placement of a target object, and 102 is a Y stage which bears the X stage 101 and is movable in the Y direction with respect to a platform 103. On the Y stage 102 is provided an X-stage driving mechanism, made up of a ball screw 104 and a motor 105, which allows the X stage 101 to move in the X direction with respect to the Y stage 102. On the platform 103 is provided a Y-stage driving mechanism, made up of a ball screw 106 and a motor 107, which allows the Y stage to move in the Y direction with respect to the platform 103. By means of the foregoing structure, the X stage 101 can be positioned in the X and Y directions with respect to the platform 103. Further, on the platform 103 are provided mass bodies 108 through 111, which are movable in the X direction or the Y direction. The mass bodies are moved by ball screws 112 through 115 and motors 116 through 119, in order to cancel out reaction force and moment generated by motion of the stages.

With the foregoing structure, force generated in the platform by acceleration and deceleration of the stages is canceled out by motion of the mass bodies, thus absorbing vibration of the platform due to acceleration or deceleration of the stages.

In the foregoing structure, when the X stage is accelerated in a position offset from the center of gravity of the platform, in order to cancel out the moment arising in the platform, a mass body in a position symmetrical with that of the X stage with respect to the center of gravity of the platform is driven with acceleration in the same direction, relative to the other mass body, as the direction in which the center of gravity of the X stage is moving.

However, if, as shown in FIG. 7, the X stage continues a motion whereby it revolves around the center of gravity of the platform, positioning offset of the mass bodies accumulates, thus necessitating a stroke for driving the mass bodies. Further, regardless of how long the stroke of a mass body is made, if the moment arising in the platform is in the same direction, the position of the mass body will reach the end of its stroke.

SUMMARY OF THE INVENTION

The present invention has been made to solve the foregoing problems, and it is an object hereof to reduce reaction force, etc., caused by motion of a stage, while reducing the stroke lengths of mass bodies.

It is another object of the present invention to enable vibration caused by moving a mass body using a position compensation control system to be eliminated by an anti-vibration mechanism, and to enable reduction of mass body positioning offset without impairing performance of a positioning device.

It is a further object of the present invention to reduce the influence caused by moving a mass body using a position compensation control system to less than the precision required of a positioning device, and to maintain positioning precision while reducing the stroke lengths of mass bodies.

It is a further object of the present invention to enable the influence of a reaction force accompanying motion of a stage to be suppressed to less than the precision required of a positioning device, by moving mass bodies.

It is a further object of the present invention to shorten motion strokes of bass bodies while reducing reaction force in a parallel direction or in a rotational direction, caused by motion of stage. In particular, it is an object of the present invention to enable reduction of a reaction force in a rotational direction within the limited motion stroke of mass bodies.

It is a further object of the present invention to maintain highly precise positioning during exposure, when high precision is called for, by not performing compensation of mass body positioning offset.

Other features and advantages of the present invention will be apparent from the following description with reference to the accompanying drawings, in which like reference symbols designate the same or similar parts throughout the figures thereof.

BRIEF DESCRIPTION OF THE DRAWINGS

The accompanying drawings, which are incorporated in and constitute a part of the Specification, illustrate embodiments of the present invention and, together with the description, serve to explain the principles of the invention.

FIG. 7 is an explanatory drawing concerning motion of a mass body when a stage is driven so as to revolve around a center of gravity.

DETAILED DESCRIPTION OF THE PREFERRED EMBODIMENT

Figure 1:
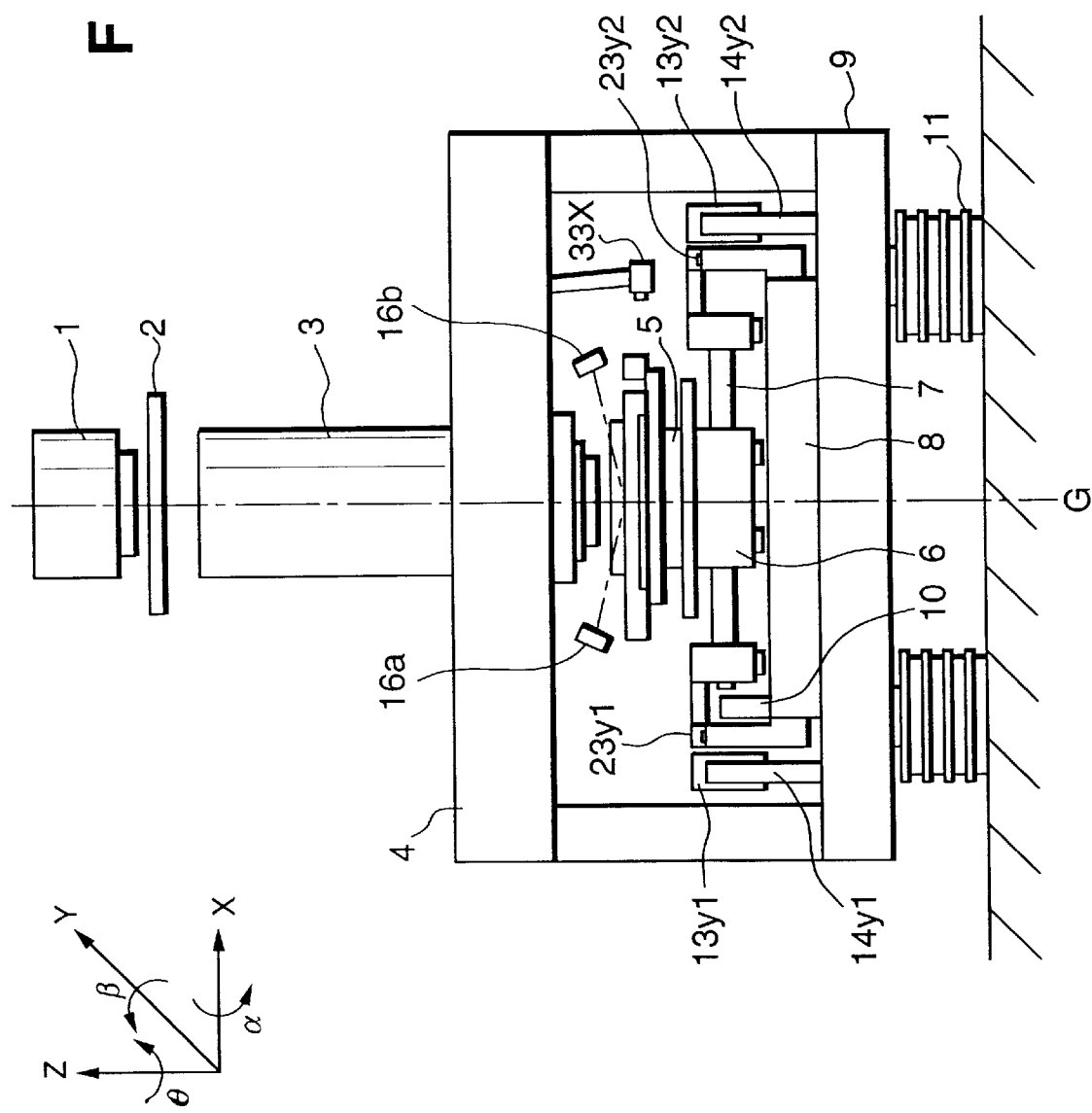
FIG. 1 is a front view of an exposure device according to a first embodiment of the present invention.

Preferred embodiments of the present invention will now be described in detail with reference to the accompanying drawings.

In the drawings, common or corresponding parts will be given the same reference symbols.

[FIRST EMBODIMENT]

Figure 2:
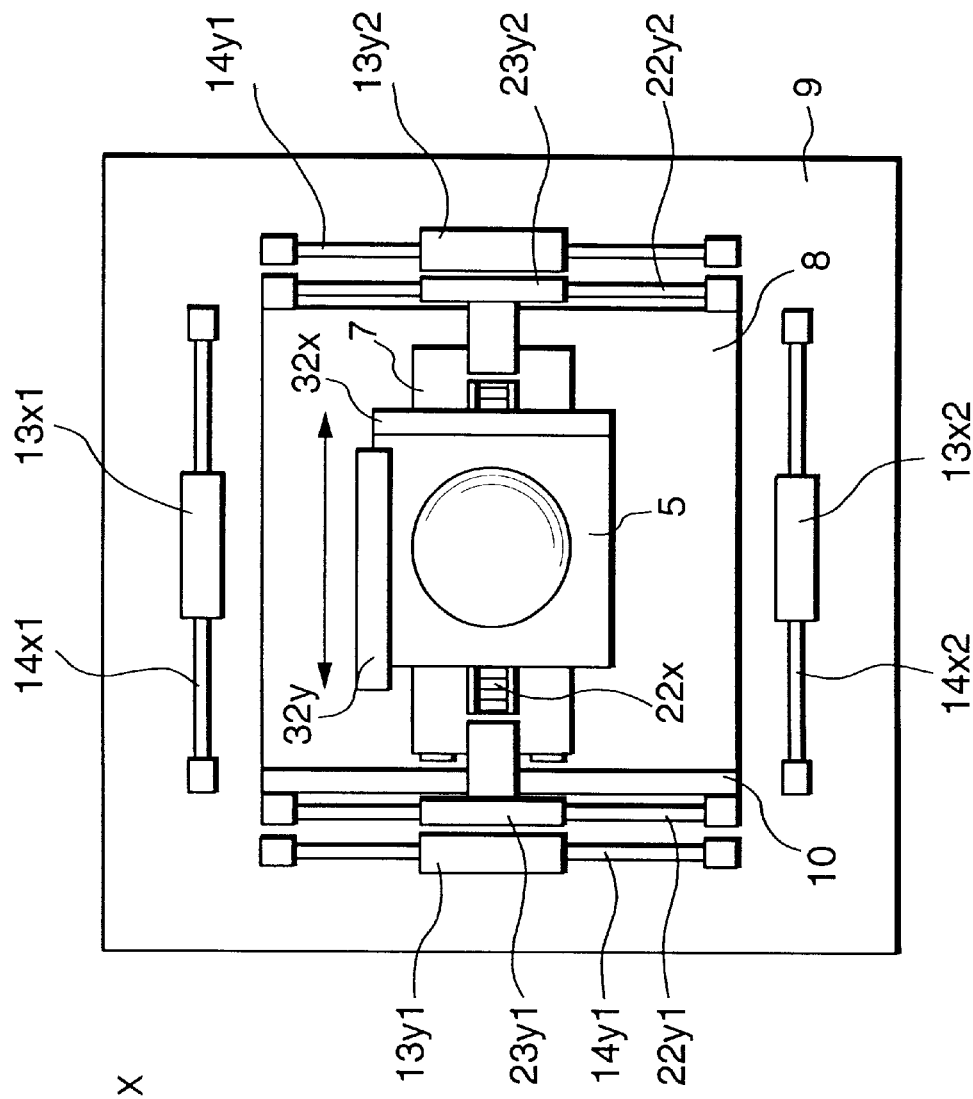
FIG. 2 is a top view of a positioning stage device according to the first embodiment.

The following will explain one embodiment of the present invention with reference to the drawings. FIG. 1 is a front view of an exposure device according to the first embodiment, which best shows the distinguishing features of the present invention. FIG. 2 is a top view of a positioning stage device in the exposure device shown in FIG. 1.

In FIGS. 1 and 2, 2 is a reticle having a pattern to be projected, 1 is an illumination unit, which illuminates the reticle with exposure light, and which includes a light source, an illumination lens, etc. 3 is a projecting lens, which projects the pattern of the illuminated reticle onto a wafer at a certain rate of reduction, and 4 is a lens-barrel holder, which holds the projecting lens 3.

5 is a top stage for placement of the wafer (not shown), and is structured so as to be movable in $\theta$, Z, $\alpha$, and $\beta$ directions. 6 is an X-Y stage, which holds the top stage 5, and which is movable in X and Y directions, and 7 is a movable guide, which supports the X-Y stage 6 in the Y direction, without touching it, through a static pressure gas bearing unit, and guides the X-Y stage 6 so as to be movable in the X direction. 8 is a stage base whose upper surface is a guide surface, and supports the X-Y stage 6 and the movable guide 7 in the Z direction, without touching them, through a static pressure gas bearing unit, and 10 is a yaw guide integrally attached to the stage base 8, which supports the movable guide 7 in the X direction, without touching it, through a static pressure gas bearing, and guides the movable guide 7 so as to be movable in the Y direction. $22x$ (FIG. 2) is a stator of a linear motor for driving the X-Y stage 6 in the X direction, and is fixed to the movable guide 7. A movable element of the linear motor is attached to the X-Y stage 6. $22y1$ and $22y2$ are stators of a linear motor for driving the movable guide 7 in the Y direction, and are fixed to opposite sides of the stage base. $23y1$ and $23y2$ are movable elements of the linear motor for driving the movable guide 7 in the Y direction, and are fixed to opposite sides of the movable guide 7.

9 is a platform which holds the stage base 8, and the platform 9 and the stage base 8 are integrally fixed to each other. Further, the platform 9 and the lens-barrel holder 4 are integrally linked together. 11 are air mounts (vibration absorbing mechanism) located in four places to support the lens-barrel holder 4. The air mounts 11 insulate the lens-barrel holder 4 and the platform 9 from vibration transmitted from the floor. Incidentally, there is no limitation to four air mounts; it is sufficient if there are at least three air mounts.

$33x$ is a laser interferometer provided on the lens-barrel holder 4, for measuring the relative positions of the projecting lens 3 and the X-Y stage 6. $16a$ is a light projector of a focus detecting unit which measures the distance between the focus position of the projecting lens 3 and the upper surface of the wafer, and $16b$ is a photoreceptor of the focus detecting unit. The light projector $16a$ and the photoreceptor $16b$ are fixed to the projecting lens 3.

13 ($13x1$, $13x2$, $13y1$, and $13y2$) are mass bodies for imparting inertia to the platform 9, and 14 ($14x1$, $14x2$, $14y1$, and $14y2$) are guides for supporting and guiding the mass bodies 13, and are fixed to the platform 9. Here, since the platform 9 is integral with the stage base 8, the guides 14 may instead be provided on the stage base 8. The axis of action of the force produced when driving the mass bodies is substantially parallel to the planes of action of the forces produced when the top stage 5, the X-Y stage 6, and the movable guide 7 are driven in the X or Y directions. Further, the planes in which these forces are produced are in a common plane, vertically. The reason for this is that if, for example, the driving forces of the X-Y stage 6 and the mass bodies were produced in planes which do not coincide vertically, these forces would produce a rotation force overall. In addition, the axis of action of force produced by each mass body is located in a position separate from a center-of-gravity axis G of the structure formed integrally with the platform 9 (including the stage base 8, the projecting lens 3, the lens-barrel holder 4, etc.). In this way, it is possible to effectively impart a moment to the foregoing structure by, for example, driving opposite mass bodies $13y1$ and $13y2$ in opposite directions.

Figure 3:
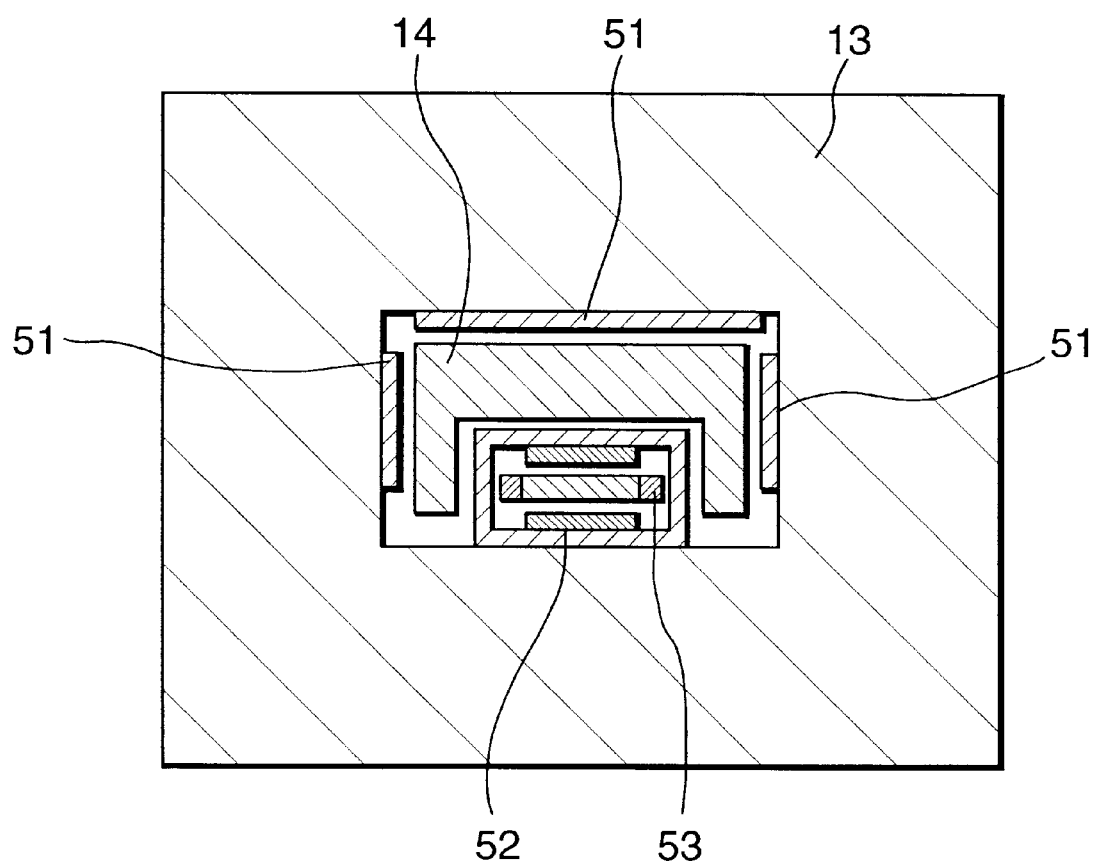
FIG. 3 is a cross-sectional view of a mechanism for imparting inertia.

FIG. 3 is a cross-sectional view showing the detailed structure of a mechanism for imparting inertia, made up of a mass body 13 and a guide 14. In FIG. 3, 51 are static pressure gas bearings, each of which supports and guides the mass body 13 in one direction, 52 is a movable element of a linear motor for driving the mass body 13, and is fixed to the mass body 13. 53 is a stator of the linear motor, and one or both ends of the stator are fixed to the guide 14. Here, it is preferable if the axis of the driving force of the linear motor substantially coincides with the position of the center of gravity of the mass body 13. In order to meet this condition, the present embodiment adopts a mass body shaped like a rectangular tube, but the mass body is not limited to this shape.

Figure 4:
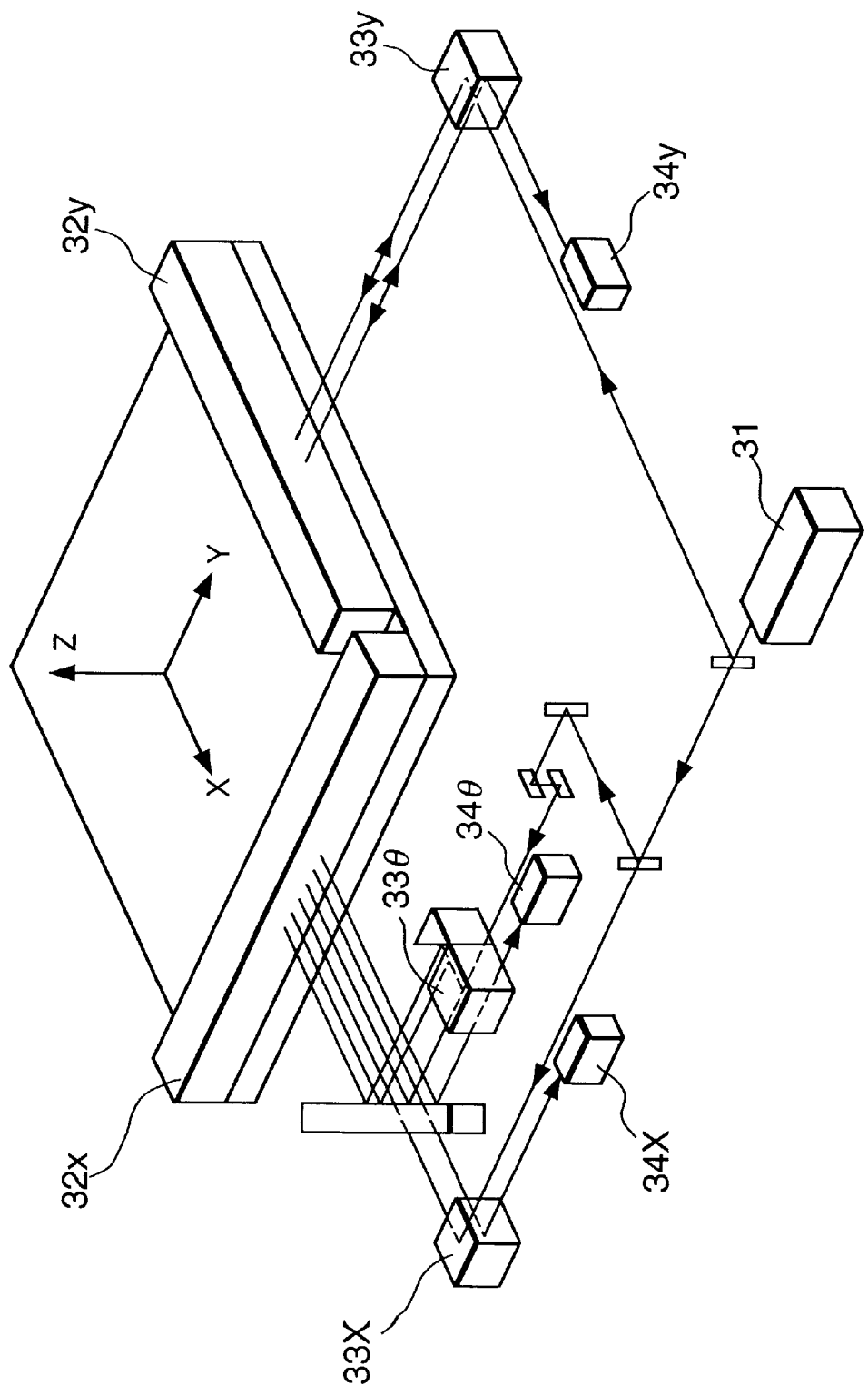
FIG. 4 is a perspective view of a measuring system according to the first embodiment.

FIG. 4 is a perspective view showing a measuring system (laser measuring system) for the X-Y stage 6 of the exposure device according to the present embodiment, and shows in detail parts around the top stage 5 shown in FIG. 1, including the laser interferometer 33x.

In FIG. 4, 31 is a laser head (light source), 32x and 32y are reflection mirrors attached to the top stage 5 shown in FIG. 1, 33x is an interferometer which measures in the X direction, and 33θ is an interferometer which measures yaw of the top stage 5, i.e., measures in the θ direction with respect to a light axis of the projecting lens 3. 34x, 34y and 34θ are receivers which convert interference bars into electrical signals, 34x being used for the X direction, 34y for the Y direction, and 34θ for the θ direction.

Figure 5:
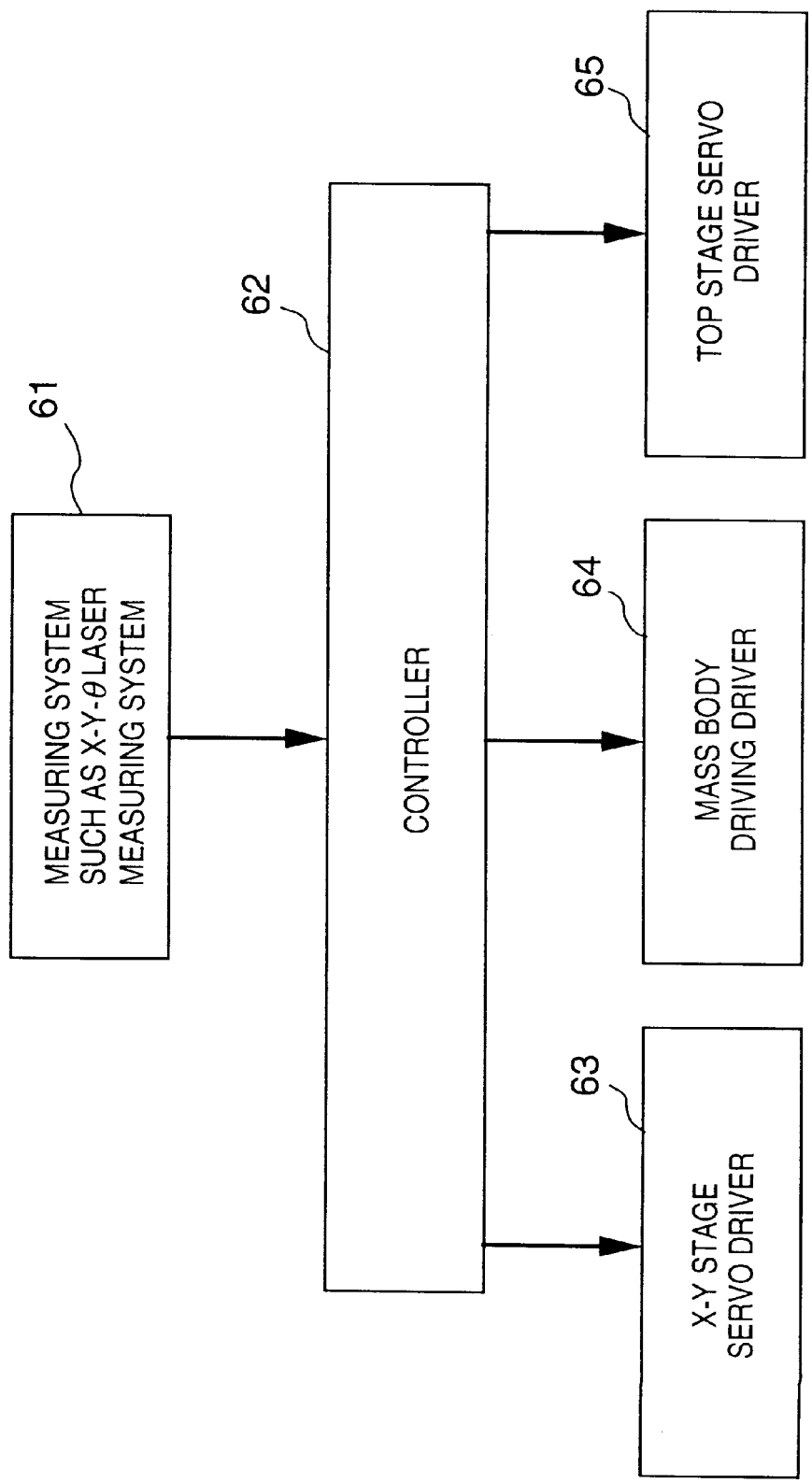
FIG. 5 is a system diagram showing a control system according to the first embodiment.

FIG. 5 is a system diagram of a control system according to the present embodiment.

In FIG. 5, 61 is the X-Y-θ laser measuring system shown in FIG. 4, and measures the position of the X-Y stage 6 holding the top stage 5, and the position of each mass body 13. 62 is a controller which uses feedback of position signals from the X-Y stage 6, the top stage 5, and each mass body 13 to give predetermined operating commands to their respective driving axes. 63 is a driver which, based on the command signals from the controller 62, drives the X-Y stage 6 by supplying a current to the coils of the linear motor stators 22x and 22y. 64 is a driver which drives the mass bodies 13 (13x1, 13x2, 13y1, and 13y2) based on the commands from the controller 62. 65 is a driver which drives each driving axis of the top stage 5. Driving control of the mass bodies 13 is performed by measuring (not shown) and feeding back the positions or accelerations of the mass bodies 13.

The following will explain exposure operations of the exposure device structured as described above. First, a wafer (not shown) to be exposed is placed on the top stage 5, and, using an external controller (not shown) to apply driving signals to the X-Y stage 6 and the top stage 5, the wafer is placed in a predetermined position and attitude under the projecting lens 3. Here, deviation of the wafer from target positions in the X, Y, and Z directions, and in the respective rotation directions of each axis (α, β, and θ directions, respectively) are calculated by the external controller on the basis of signals from the laser measurement system, and fed back to each driving unit to perform positioning control to place the wafer in the predetermined position and attitude. After exposure, the wafer is moved to the next predetermined position, and exposure is repeated. To move the X-Y stage 6, the controller 62 applies to the linear motor driver 63 command signals in accordance with a predetermined velocity curve, and the linear motor produces a driving force corresponding to these command signals. This driving force is equal to an inertia determined by the mass of the X-Y stage 6 and a predetermined acceleration and deceleration, and a reaction force due to this driving force acts on the stage base 8 and is transmitted to the platform 9. At this time, the controller 62 applies command signals to the mass body driver 64 to cancel out the foregoing driving reaction force, and the mass bodies 13x and 13y are driven so as to suppress displacement of the platform 9 as much as possible.

Figure 6:
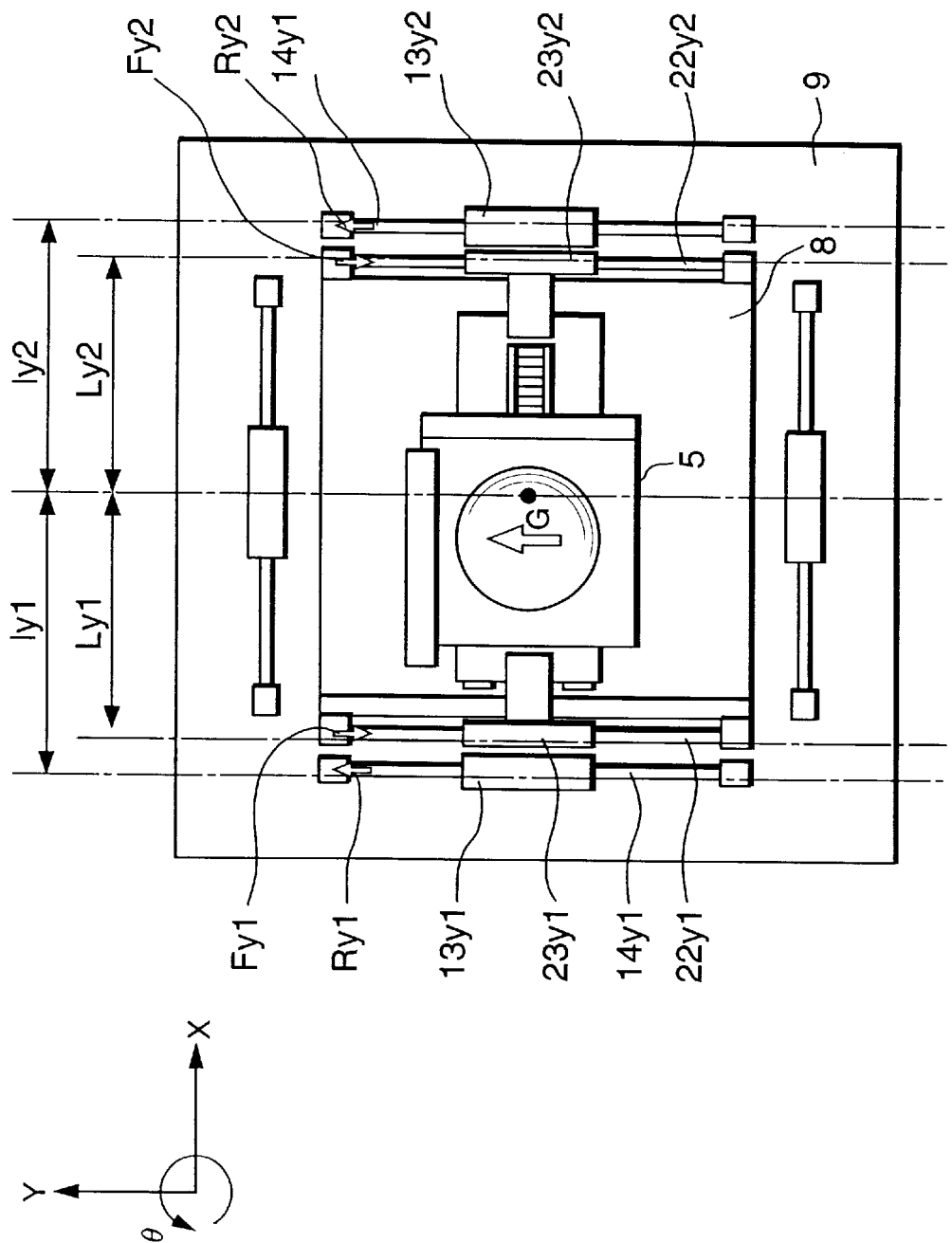
FIG. 6 is an explanatory drawing showing driving according to the first embodiment.

Next, driving signals for driving the stage in the Y direction will be explained with reference to FIG. 6.

Here, reaction force exerted on the linear motor stators 22y1 and 22y2 when driving the moving body (which includes the X-Y stage 6, the top stage 5, etc.) in the Y direction is shown by Fy1 and Fy2, and reaction force produced by driving the mass bodies 13y1 and 13y2 is shown by Ry1 and Ry2. Further, distances from the center of gravity G of the structure formed integrally on the platform 9 to the reaction force exerted on the linear motor stators 22y1 and 22y2 are shown by Ly1 and Ly2, respectively, and distances from the center of gravity G to the reaction force produced by driving the mass bodies 13y1 and 13y2 are shown by ly1 and ly2, respectively. Accordingly, the reaction forces Ry1 and Ry2 can be found by solving the following simultaneous equations.

$$Ry1+Ry2=-(Fy1+Fy2) \quad -Ry1 \times ly1+Ry2 \times ly2=-(-Fy1 \times Ly1+Fy2 \times Ly2)$$

The first equation is a balance of force equation, and the second equation is a balance of rotational torque equation. If the mass bodies 13y1 and 13y2 are appropriately moved to satisfy the foregoing equations, when driving the moving body (which includes the X-Y stage 6, the top stage 5, etc.) in the Y direction, reaction force and rotational torque exerted on the structure including the platform 9 will be cancelled out, and the center of gravity of the entire mass supported by the anti-vibration air mounts 11 will be maintained in a fixed position.

Further, if the mass of the mass bodies 13y1 and 13y2 is increased with respect to the mass of the body moving in the Y direction (the total of the top stage 5, the X-Y stage 6, and the movable guide 7), the necessary driving stroke for the mass bodies 13y1 and 13y2 can be shortened, and the energy needed to drive the mass bodies 13y1 and 13y2 can be reduced.

However, if, as shown in FIG. 7, the moving body including the X-Y stage 6 is driven so as to revolve in a single direction around the center of gravity G, it is necessary, in order to satisfy the second equation above, to continually move the mass bodies 13y1 and 13y2 in mutually opposite directions. In other words, unless the driving pattern is such that the accumulated sum of the rotational torque of the moving body including the X-Y stage 6 is zero, the relative positions of the mass bodies 13y1 and 13y2 become farther apart, and an infinitely long stroke eventually becomes necessary. For this reason, it is necessary to limit the stroke length to some predetermined value.

Figure 8:
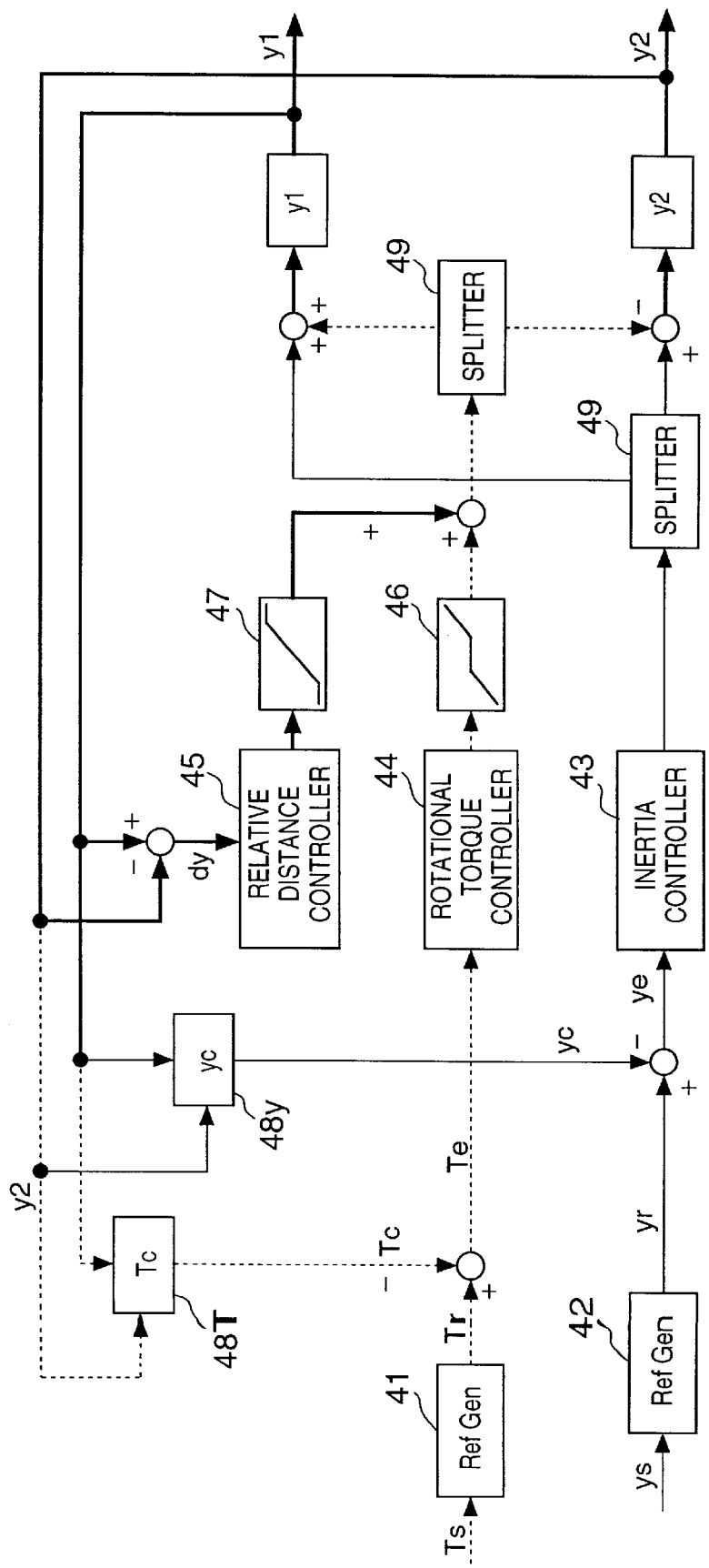
FIG. 8 is a block diagram showing mass body driving control.

FIG. 8 is a block diagram showing mass body driving control.

41 and 42 are reference value generators which, based on the position of the X-Y stage 6 and on its reaction force in a parallel direction (inertia) and in a rotational direction (rotational torque), generate reference values for driving the mass bodies 13y1 and 13y2. 43 is an inertia controller, which controls inertia produced by the mass bodies such that it is a reference value. 44 is a rotational torque controller, which controls rotational torque produced by the mass bodies such that it is a reference value. 45 is a relative distance controller, which controls the mass bodies 13y1 and 13y2 so that their relative distance is zero. 46 is a selector for the rotational torque controller 44 (details to be discussed below), and 47 is a selector for the relative distance controller 45 (details to be discussed below). Further, 48T is computer for calculating, based on y1 and y2, rotational torque produced by the mass bodies, and 48y is a computer for calculating, from y1 and y2, the location of the center of gravity (or driving reaction force) of the mass bodies together. Splitter 49 is a splitter for suitably allocating commands from the various controllers to y1 and y2.

In FIG. 8, the-control system shown by thin solid arrows is a center of gravity/reaction force compensating system (reaction force compensating system), and is a system for controlling the mass bodies so as to cancel out reaction force in a parallel direction, produced by motion of the stages.

Since compensation of the center of gravity and compensation of reaction force are equivalent, the center of gravity/reaction force system may instead be structured as a position feedback system. Further, the broken lines show a torque compensating system (reaction force compensating system), which is a system for controlling the mass bodies so as to cancel out reaction force in a rotational direction, produced by motion of the stages. Further, the thick solid lines show a pull-back compensating system (position compensating system), which is a system for controlling the mass bodies so as to reduce their relative distance (positioning offset).

When the relative distance controller 45 is activated by the selector 47, driving control is performed so as to bring the relative distance between the mass bodies 13y1 and 13y2 to zero. In this way, it is possible to limit the range of motion of the mass bodies. However, this will also produce rotational torque which would not normally be produced, causing the structure including the platform 9 to vibrate. Further, if both selectors 46 and 47 are activated simultaneously, the rotational torque controller 44 and the relative distance controller 45 attempt to perform opposite actions, and the control system ceases to function effectively. Accordingly, it is necessary to use the selectors 46 and 47 appropriately, to cancel out reaction force produced by motion of the X-Y stage, etc., and to prevent accumulation of relative distance of the mass bodies. Several possible methods of realizing this kind of control are given below.

1. A high-pass filter is used for the selector 46, and a low-pass filter for the selector 47, and the cut-off frequencies of these filters are set to approximately the same as or lower than an effective frequency for the air mounts 11. In this case, rotational torque produced by functions of the relative distance controller 45 and rotational torque the rotational torque controller 44 is unable to eliminate will be low-frequency component rotational torque, which the air mounts 11 are able to absorb. In other words, the high-frequency component of the rotational torque produced in the structure can be eliminated by motion of the mass bodies, and the low-frequency component can be eliminated by the air mounts 11. In addition, as rotational torque is eliminated, the relative distance controller 45 operates effectively at a low frequency, and accordingly the relative distance of the mass bodies can be gradually brought toward zero.

2. Each selector 46 and 47 is provided with a frigid zone or limiter, and the width of the frigid zone or limit of the limiter is set to around a level of vibration which does not affect exposure. In this way, rotational torque produced by functioning of the relative distance controller 45 and rotational torque the rotational torque controller 44 is unable to eliminate can be brought to a level of vibration which does not affect exposure, and exposure will not be impaired. In other words, vibration which will influence exposure and high-level vibration (vibration of high amplitude, etc.) can be eliminated by motion of the mass bodies, and the relative distance controller 45 operates effectively at a level which does not influence exposure, and accordingly the relative distance of the mass bodies can be gradually brought toward zero.

3. The selectors 46 and 47 are switched according to the level of precision needed. In other words, the selector 46 is switched so as to operate effectively when high precision is needed, e.g., during exposure, and is deactivated when precision is less needed, e.g., at times other than during exposure. Meanwhile, the selector 47 is switched so as to be deactivated during exposure, etc., and to operate effectively at other times. In this way, during exposure, vibration of the structure can be reduced by driving the mass bodies by the rotational torque controller 44, and at other times, relative distance of the mass bodies accumulated during exposure can be brought to zero by the relative distance controller 45.

4. The selectors 46 and 47 are switched according to the positions of the mass bodies. In other words, the selector 46 is switched so as to be activated when the absolute or relative distance between the mass bodies 13y1 and 13y2 is within a predetermined value, and deactivated when the predetermined value is exceeded and the stroke limit is approached. Meanwhile, the selector 47 is switched so as to be deactivated when the absolute or relative distance between the mass bodies 13y1 and 13y2 is within a predetermined value, and activated when the predetermined value is exceeded and the stroke limit is approached. In this way, except in a situation where the stroke length of the mass bodies is insufficient, rotational torque can be eliminated by driving the mass bodies by the rotational torque controller 44.

5. Several of the four methods above are combined. For example, the selector 46 is used as switching means which is activated during exposure, etc., and acts as a high-pass filter or a frigid zone at other times, and the selector 47 is used as a switching means which is deactivated during exposure, etc., and acts as a low-pass filter of a limiter at other times. In this way, at times other than during exposure, etc., the relative distance of the mass bodies can gradually be brought to zero by the relative distance controller 45, and there will be no danger of shaking the structure due to great rotational torque produced by sudden driving of the mass bodies. During exposure, on the other hand, driving the mass bodies using the rotational torque controller 44 makes it possible to eliminate not only high-frequency components and high-level vibration, but also low-frequency components and low-level vibration.

When driving in the X direction, too, reaction force in the X direction produced by motion of the top stage 5 and the X-Y stage 6 can be cancelled out by driving the mass bodies 13x1 and 13x2 in the same manner. Here, rotational torque can be eliminated using either the mass bodies 13x or the mass bodies 13y. In this case, the mass bodies not handling elimination of rotational torque need only be provided with the inertia controller 43, thus simplifying the controllers and reducing stroke length. Again, it is also possible to use both the mass bodies 13x and the mass bodies 13y to eliminate rotational torque of the structure, and in this case the mass body stroke necessary to eliminate rotational torque is distributed among the mass bodies, thus allowing reduction of the stroke of the mass bodies. Further, with a structure which uses both the mass bodies 13x and the mass bodies 13y to eliminate rotational torque, if the absolute or relative distance of one pair of mass bodies exceeds a predetermined value, the absolute or relative distance of these mass bodies can be brought back to zero while using the other pair of mass bodies to eliminate rotational torque.

As discussed above, in the present embodiment, driving reaction force in the X, Y, and θ directions, which acts on the platform 9 during acceleration of the X-Y stage 6, can be cancelled out by driving the mass bodies 13x and 13y in the opposite direction to produce an opposite driving reaction force, thus reducing the vibration transmitted to the lens-barrel holder 3. Further, by locating the mass bodies 13x and 13y on the respective axes in which X-direction driving reaction force and Y-direction driving reaction force act, the production of rotational torque can be prevented. Accordingly, magnification of individual vibrations of the entire device supported by the air mounts 11 and of each of the parts of the mechanism installed in the device can be prevented. Incidentally, the vibration absorbing mounts are not limited to air mounts, and any mechanism may be used which is capable of eliminating vibration. In particular, if active mounts are used, the range of vibration which can be eliminated is increased, which is advantageous when compensating positioning offset of the mass bodies.

Further, in the present embodiment, correction of positioning offset of the mass bodies 13x and 13y, which arises due to elimination of rotational torque, is controlled so as not to influence the precision of positioning of the stage and exposure precision of the exposure device, and thus the driving stroke of the mass bodies can be reduced.

[SECOND EMBODIMENT]

Figure 9:
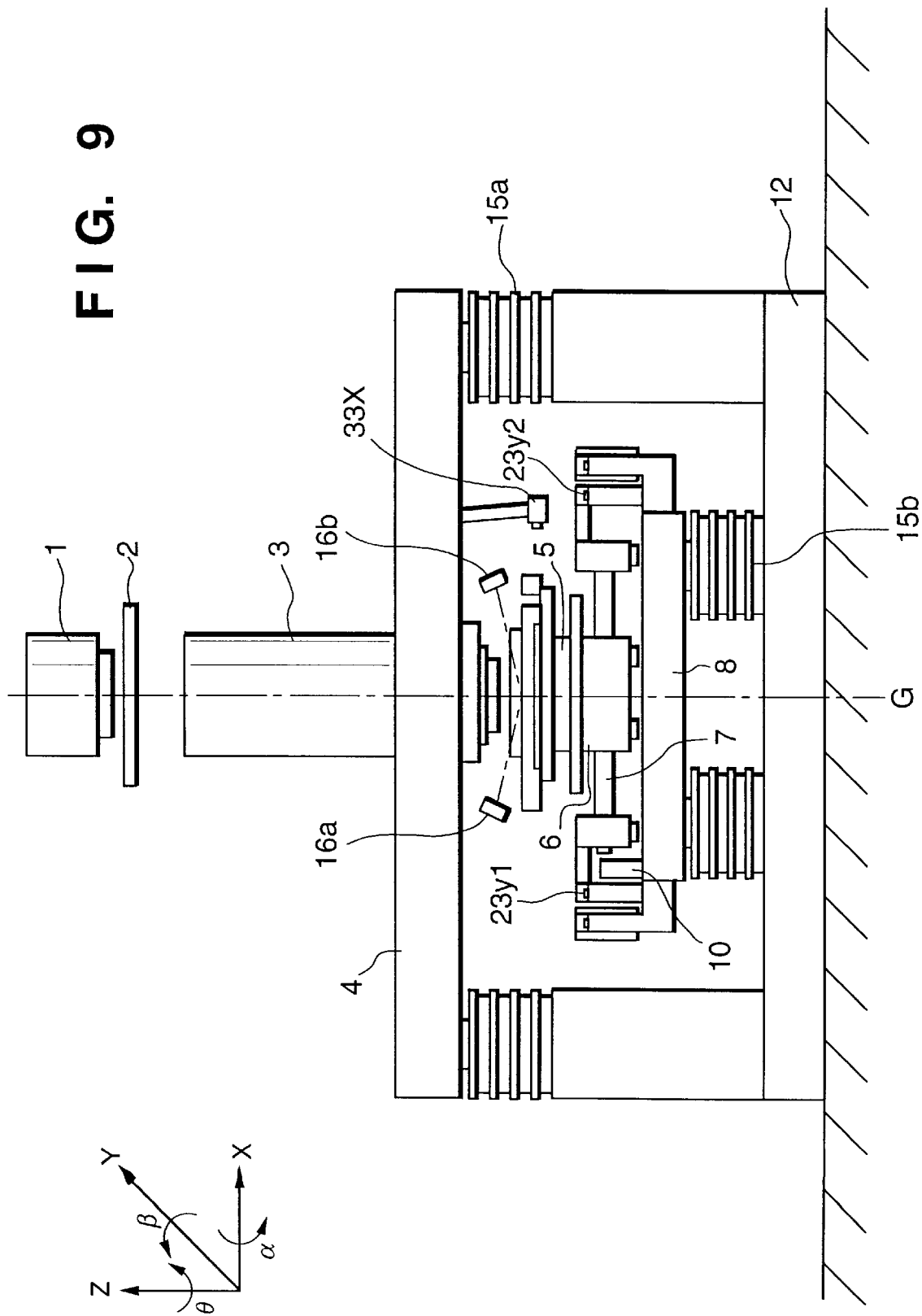
FIG. 9 is a front view of an exposure device according to a second embodiment of the present invention.
Figure 10:
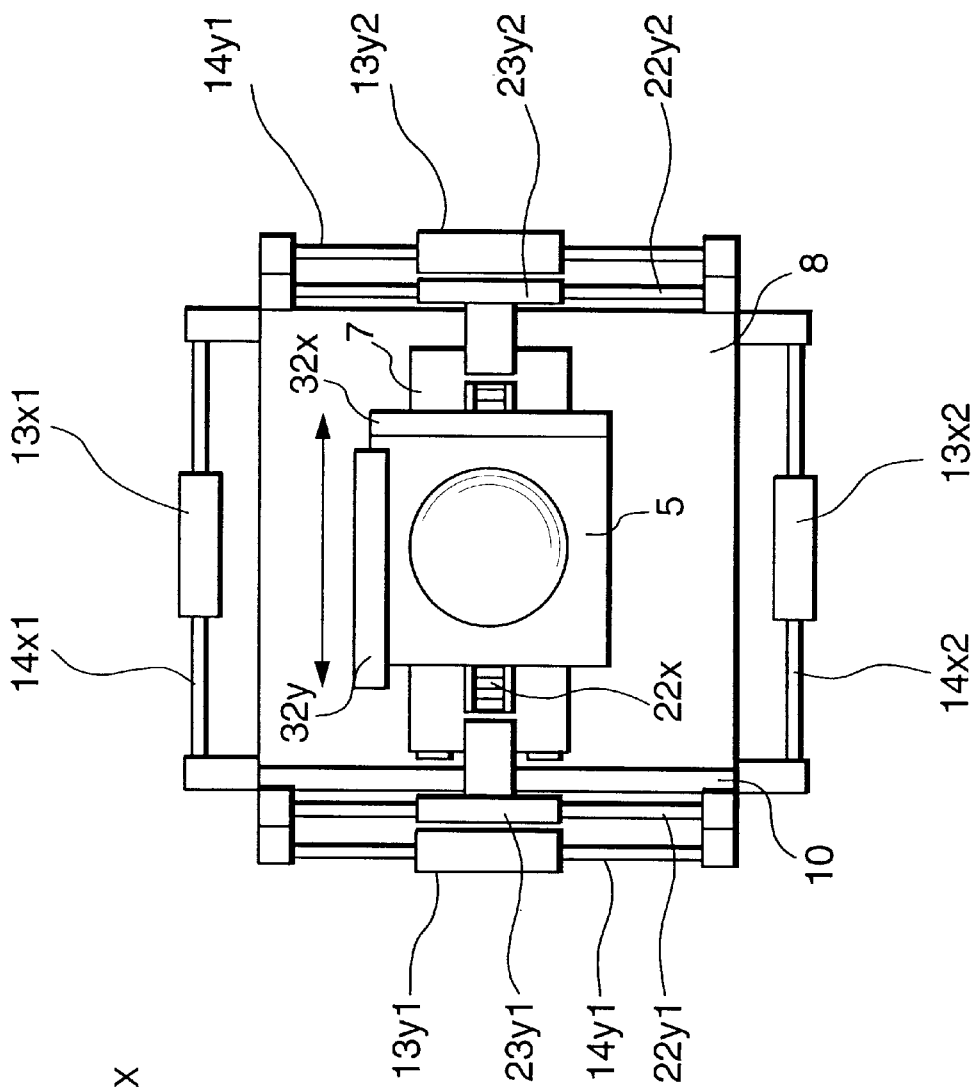
FIG. 10 is a top view of a stage section used in the exposure device according to the second embodiment.

FIG. 9 is a front view of an exposure device according to a second embodiment of the present invention, and FIG. 10 is a top view of a stage section used in the exposure device shown in FIG. 9.

In FIGS. 9 and 10, parts equivalent to those in the previous embodiment are given the same reference symbols.

Figure 15:
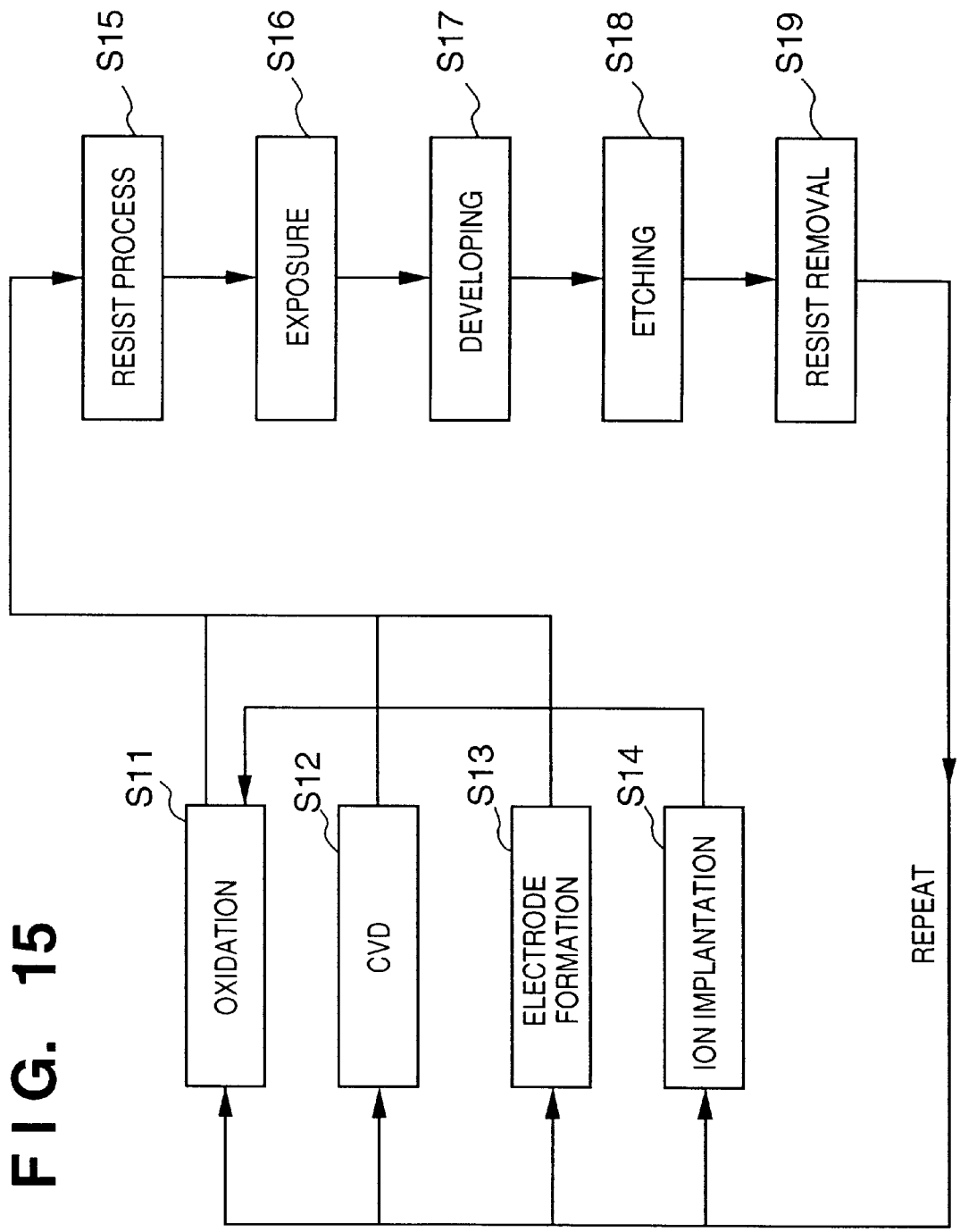
FIG. 15 is flow chart showing a wafer process.
Figure 16:
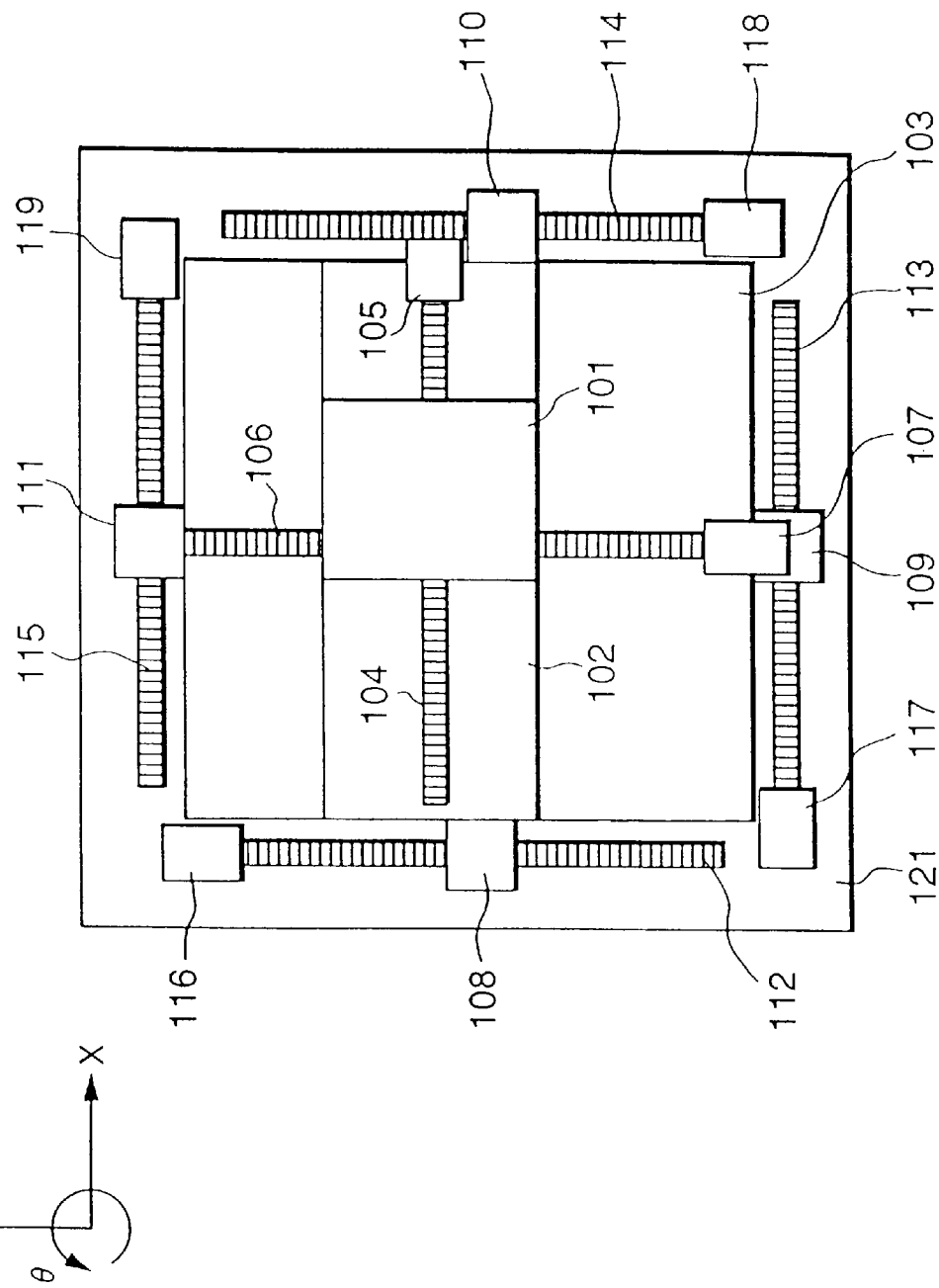
FIG. 16 is a top view of a conventional stage device.

In FIGS. 9 and 10, 15 are anti-vibration mounts provided in four places to support the stage base 8. 12 is a platform base which supports the lens-barrel holder 4 via the anti-vibration mounts 15a, and supports the stage base 8 via the anti-vibration mounts 15b. Guides 14x1, 14x2, 14y1, and 14y2, for supporting and guiding mass bodies 13x1, 13x2, 13y1, and 13y2, are fixed to the stage base 8. Axes of action of forces produced when driving the mass bodies 13 are parallel to a plane of action of forces produced when the top stage 5, the X-Y stage 6, and the movable guide 7 are driven in the X and Y directions, and are provided so as to substantially coincide with respect to a vertical direction of the plane of action. In addition, the axis of action of force produced by each mass body is located in a position separate from a center-of-gravity axis G of the structure formed integrally with the stage base 8. In this way, it is possible to effectively impart to the foregoing structure inertia in a rotation direction by, for example, driving opposite mass bodies 13y1 and 13y2 in opposite directions.

In the exposure device structured as above, as in that according to the first embodiment above, by imparting inertia to the stage base 8 by driving the mass bodies 13 (13x1, 13x2, 13y1, and 13y2) in accordance with acceleration or deceleration when moving the X-Y stage 6 and the top stage 5 to a predetermined position, vibration excited in the stage base 8 can be reduced, and individual vibration of the wafer stage system supported by the anti-vibration mounts 15b is not magnified. Moreover, since the anti-vibration mounts 15a and 15b insulate the lens-barrel holder 4 from the vibration of the wafer stage, the individual vibration of each part of the device mechanism is not magnified, and vibration is not transmitted to the projecting lens, the laser measurement system, or the focus detecting system.

Further, by using a control system equivalent to that shown in FIG. 8, stroke of the mass bodies can be shortened.

The exposure device according to the present embodiment can obtain effects equivalent to those of the first embodiment above, and thus high-speed, high-precision positioning can be attained.

[THIRD EMBODIMENT]

Figure 11:
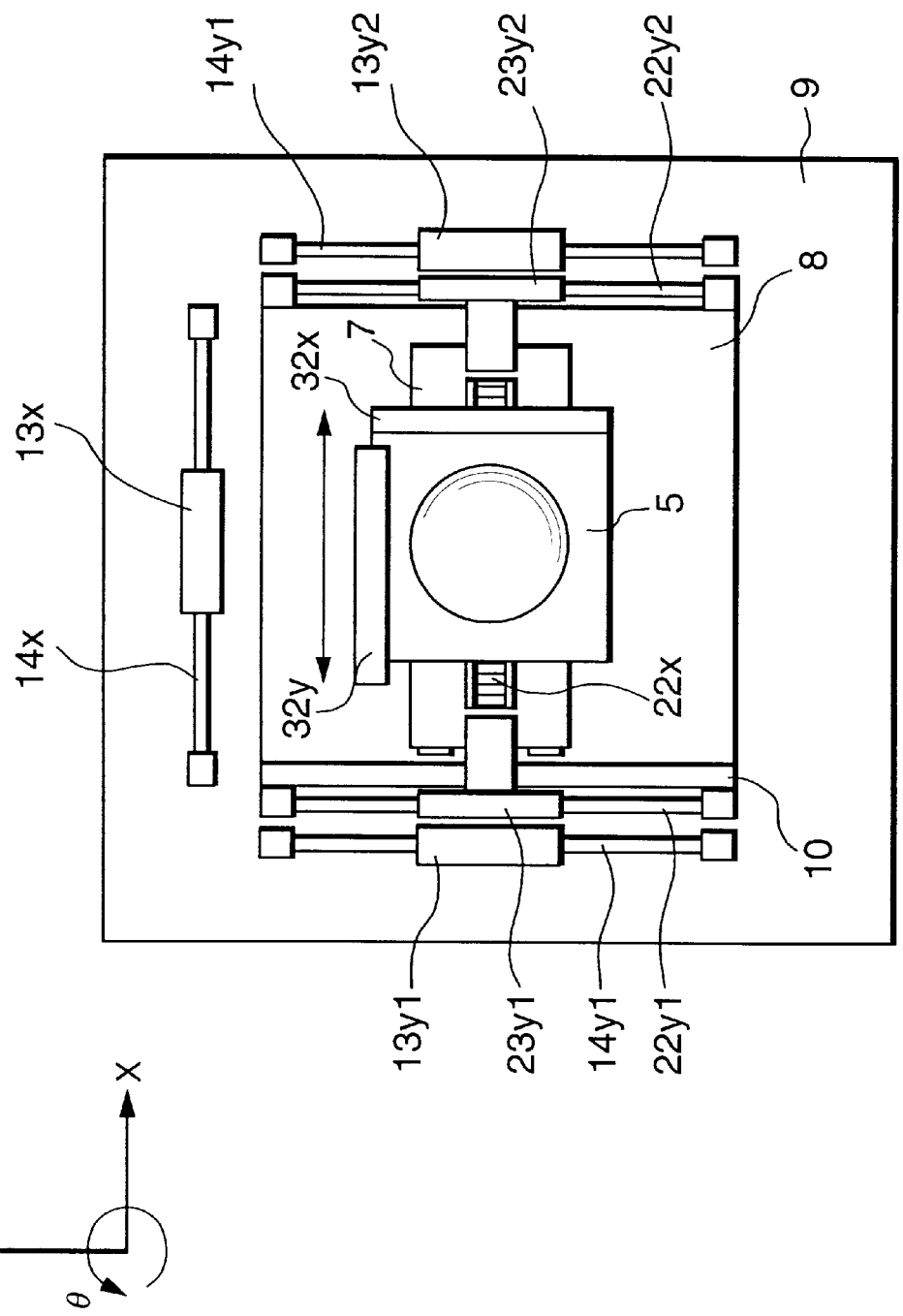
FIG. 11 is a top view of a stage section used in an exposure device according to a third embodiment of the present invention.

FIG. 11 is a top view of a stage section used in an exposure device according to a third embodiment of the present invention.

In FIG. 11, parts equivalent to those in the previous embodiments are given the same reference symbols.

In FIG. 11, 13x, 13y1, and 13y2 are mass bodies for imparting inertia to the platform 9. 14x, 14y1, and 14y2 are guides for supporting and guiding mass bodies 13x, 13y1, and 13y2, and are fixed to the platform 9. Axes of action of forces produced when driving the mass bodies 13 are parallel to a plane of action of forces produced when the top stage 5, the X-Y stage 6, and the movable guide 7 are driven in the X and Y directions, and are provided so as to substantially coincide with respect to a vertical direction of the plane of action. In addition, the axis of action of force produced by each mass body is located in a position separate from a center-of-gravity axis G of the structure formed integrally with the platform 9 (including the stage base 8, the projecting lens 3, the lens-barrel holder 4, etc.), and thus it is possible to effectively impart to the foregoing structure inertia in a rotation direction.

In the exposure device structured as above, in order to cancel out driving reaction force produced when the X-Y stage is driven in the X direction, the mass body 13x is driven, but since it is provided only on one side, the mass body 13x cannot compensate for a rotational torque component. Accordingly, the rotational torque component is compensated for by driving the mass bodies 13y1 and 13y2. When driving the X-Y stage in the Y direction, reaction force is canceled out by driving the mass bodies 13y1 and 13y2.

Further, by using a control system equivalent to that shown in FIG. 8, stroke of the mass bodies can be shortened.

The exposure device according to the present embodiment can obtain effects equivalent to those of the first embodiment above, and thus high-speed, high-precision positioning can be attained.

[FOURTH EMBODIMENT]

Figure 12:
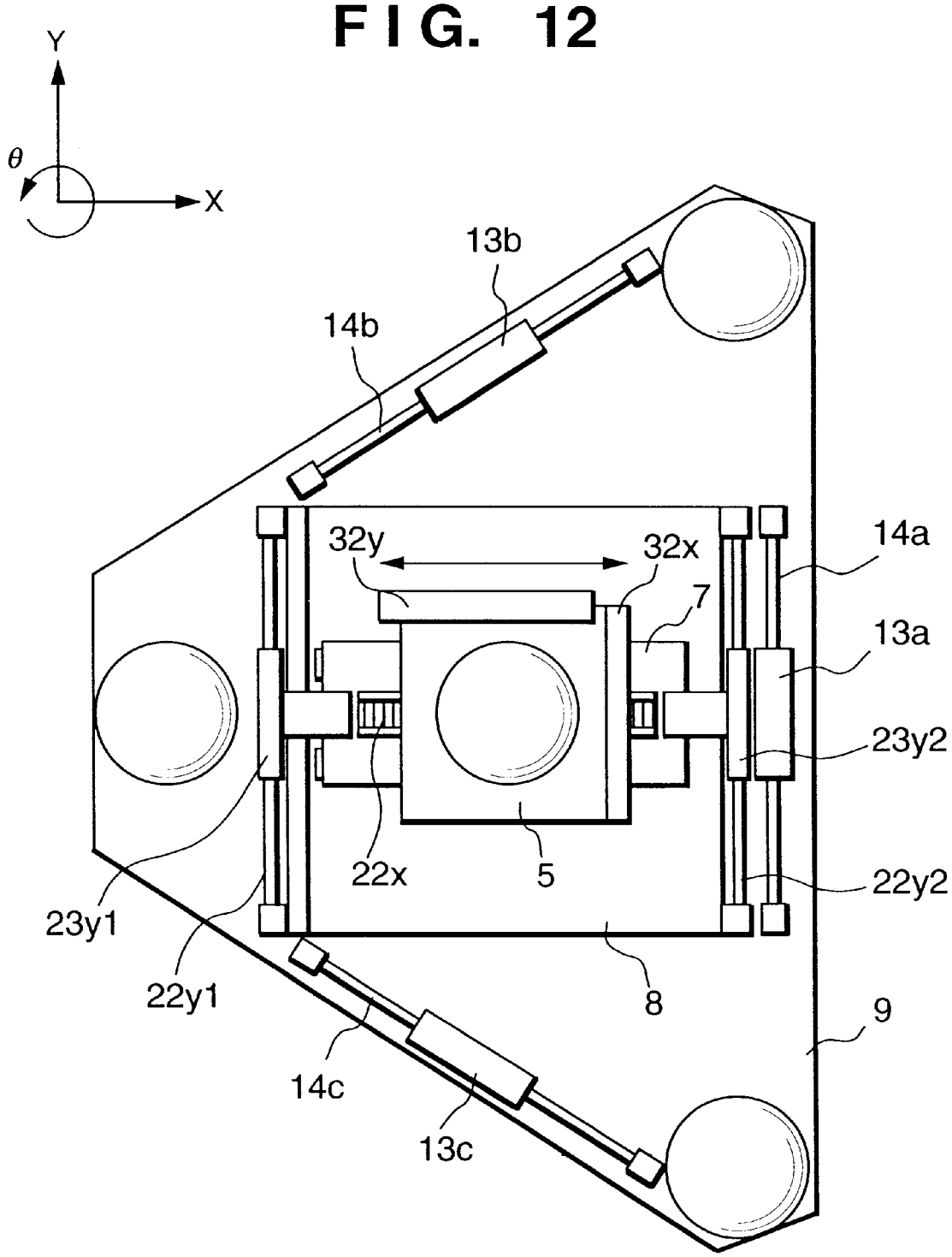
FIG. 12 is a top view of a stage section used in an exposure device according to a fourth embodiment of the present invention.

FIG. 12 is a top view of a stage section used in an exposure device according to a fourth embodiment of the present invention.

In FIG. 12, parts equivalent to those in the previous embodiments are given the same reference symbols.

In FIG. 12, 13a, 13b, and 13c are mass bodies for imparting inertia to the platform 9. 14a, 14b, and 14c are guides for supporting and guiding mass bodies 13a, 13b, and 13c, and are fixed to the platform 9. Axes of action of forces produced when driving the mass bodies 13 are parallel to a plane of action of forces produced when the top stage 5, the X-Y stage 6, and the movable guide 7 are driven in the X and Y directions, and are provided so as to substantially coincide with respect to a vertical direction of the plane of action. In addition, the axis of action of force produced by each mass body is located in a position separate from a center-of-gravity axis G of the structure formed integrally with the platform 9 (including the stage base 8, the projecting lens 3, the lens-barrel holder 4, etc.), and thus it is possible to effectively impart to the foregoing structure inertia in a rotation direction by, for example, driving the mass bodies 13b and 13c in opposite directions.

In the foregoing structure, the directions in which the mass bodies are driven do not necessarily coincide with the X and Y directions, but inertia and rotational torque can be compensated for by suitably driving the three mass bodies according to the direction of motion of the X-Y stage 6.

Further, by using a control system equivalent to that shown in FIG. 8, stroke of the mass bodies can be shortened.

The exposure device according to the present embodiment can obtain effects equivalent to those of the first embodiment above, and thus high-speed, high-precision positioning can be attained.

[FIFTH EMBODIMENT]

Figure 13:
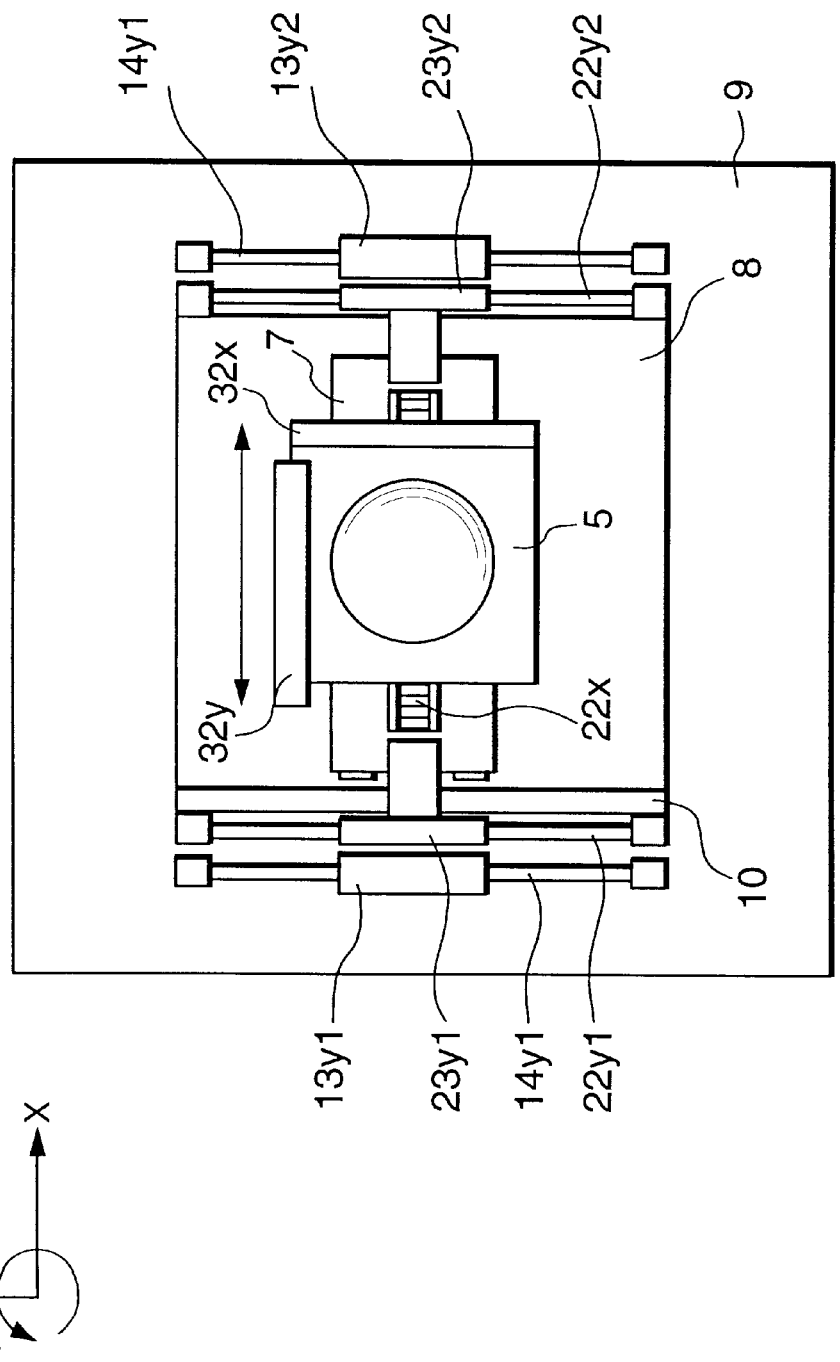
FIG. 13 is a top view of a stage section used in an exposure device according to a fifth embodiment of the present invention.

FIG. 13 is a top view of a stage section used in an exposure device according to a fifth embodiment of the present invention.

In FIG. 13, parts equivalent to those in the previous embodiments are given the same reference symbols.

In the present embodiment, there are no mass bodies which move in the X direction. Further, the direction of motion of the mass bodies 13y1 and 13y2 is parallel with a scanning direction of a scanning exposure device.

The distinguishing feature of this embodiment is that, by driving two mass bodies, movable in a direction parallel with the scanning exposure direction, in the same manner as in the foregoing embodiments, driving reaction force and rotational torque produced during scan exposure can be cancelled out. Reaction force produced by motion of the stage in the direction of the X axis cannot be compensated for, but since the scan direction during scanning exposure is the Y axis direction, it is sufficient if vibration in the X axis direction is reduced by the anti-vibration mounts during exposure.

Further, by using a control system equivalent to that shown in FIG. 8, stroke of the mass bodies can be shortened.

With the present embodiment, the stage device can be simplified, and effects substantially equivalent to those of the foregoing embodiments can be obtained.

[SIXTH EMBODIMENT]

Figure 14:
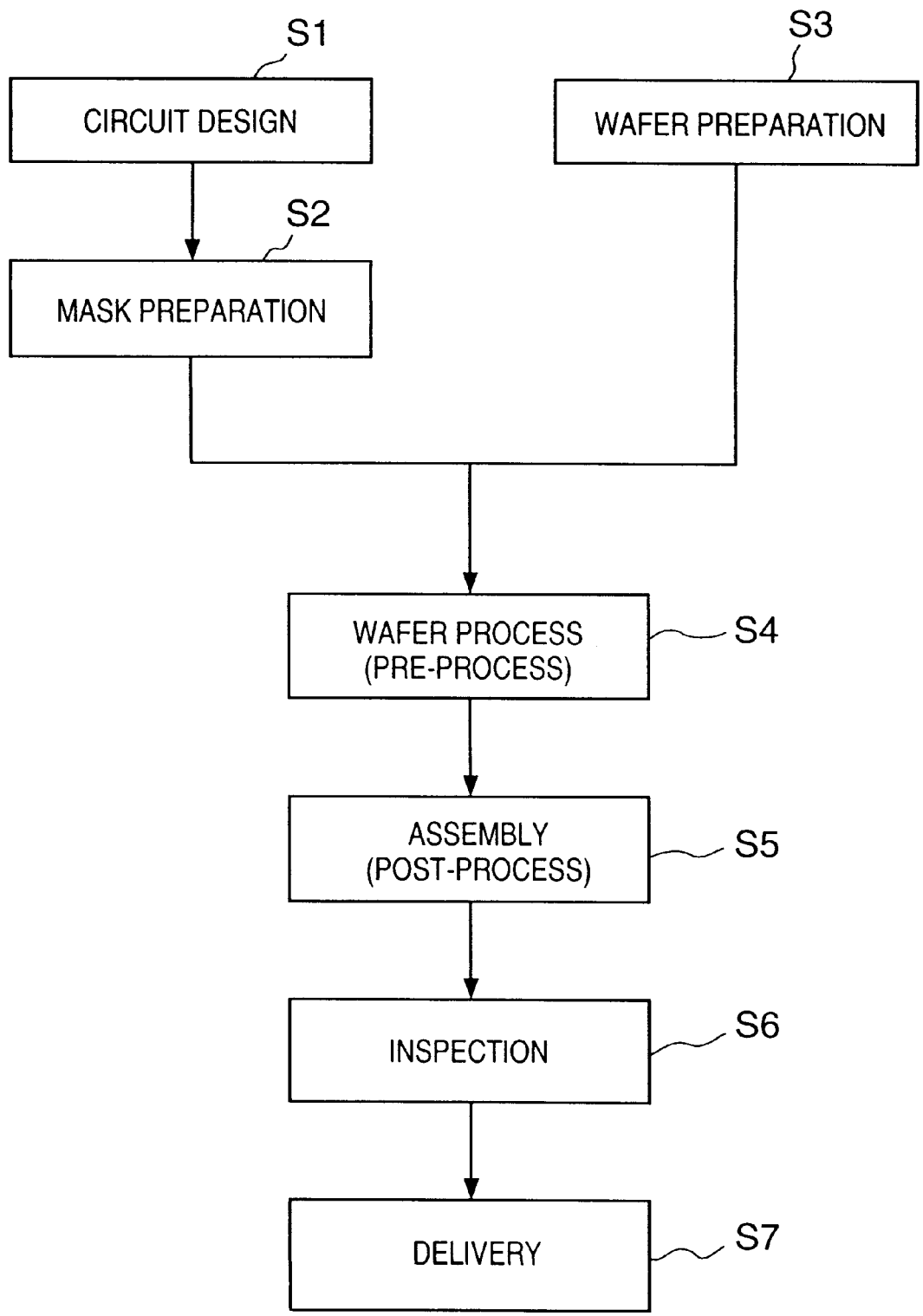
FIG. 14 is a flow chart showing manufacturing of a semiconductor device.

The following will explain an embodiment of a method of manufacturing a semiconductor device using the exposure device explained above. FIG. 14 shows the flow of manufacturing of such a semiconductor device (a semiconductor chip such as an IC or LSI, a liquid crystal panel, a CCD, etc.). In step S1 (circuit design), the circuit of the semiconductor device is designed. In step S2 (mask preparation), a mask forming the pattern of the circuit designed above is prepared. In step S3 (wafer preparation), a wafer is prepared using a material such as silicon. In step S4 (wafer process), called the "preprocess," using the mask and wafer prepared above, the actual circuit is formed on the wafer by lithography. Step S5 (assembly), called the "post-process," is a step in which the wafer prepared in the foregoing steps S1 through S4 is turned into a semiconductor chip, and includes steps such as assembly (dicing, bonding) and packaging (chip sealing). In step S6 (inspection), inspections such as an operation confirmation test and a durability test are performed on the semiconductor device prepared in step S5. The semiconductor device completed according to the foregoing steps is then delivered in step S7.

FIG. 15 shows the detailed flow of the foregoing wafer process. In step S11 (oxidation), the surface of the wafer is oxidized. In step S12 (CVD), an insulating flim is formed on the surface of the wafer. In step S13 (electrode formation), electrodes are formed on the wafer by deposition. In step S14 (ion implantation), ions are implanted into the wafer. In step S15 (resist process), a photosensitive agent is coated onto the wafer. In step S16 (exposure), the circuit pattern of the mask is exposed onto the wafer using the exposure device explained above. In step S17 (developing), the exposed wafer is developed. In step S18 (etching), portions other than the developed resist are etched away. In step S19 (resist removal), resist no longer needed after etching is removed. By repeating these steps, a circuit pattern in multiple layers can be formed on the wafer. Using the manufacturing method according to the present embodiment, it is possible to manufacture semiconductor devices of high integration, which was difficult using conventional methods.

As explained above, with the present invention, the motion stroke of mass bodies can be shortened while reducing reaction force due to motion of the stage.

Further, with the present invention, vibration caused by moving the mass bodies using a position compensation control system can be eliminated by an anti-vibration mechanism, and thus positioning offset of the mass bodies can be reduced without impairing performance of the positioning device.

In addition, with the present invention, the influence caused by moving the mass bodies using a position compensation control system is within the precision required of the positioning device, and thus the motion stroke of mass bodies can be shortened while maintaining positioning precision.

Moreover, with the present invention, by moving the mass bodies, the influence of reaction force due to motion of the stage can be suppressed to within the precision required of the positioning device.

Furthermore, with the present invention, the motion stroke of mass bodies can be reduced while reducing reaction force in parallel and rotational directions produced by motion of the stage. In particular, reaction force in the rotational direction of the stage can be reduced within a limited motion stroke of the mass bodies.

In addition, with the present invention, during exposure, when high precision is called for, compensation of offset in positioning of the mass bodies is not performed, and thus high positioning precision can be maintained.

As many apparently widely different embodiments of the present invention can be made without departing from the spirit and scope thereof, it is to be understood that the invention is not limited to the specific embodiments thereof except as defined in the claims.

What is claimed is:

1. A positioning device comprising:

a stage base having a reference surface;

an anti-vibration mechanism, which supports said stage base and a structure integral with said stage base;

a stage which is movable along said reference surface; and an inertia imparting mechanism including a mass body which is movable, within a predetermined stroke range, with respect to said stage base, and a mass body driving mechanism for driving said mass body, wherein said inertia imparting mechanism includes a reaction force compensation control system, which outputs to said mass body driving mechanism signals for driving said mass body to reduce reaction force produced by motion of said stage, and a position compensation control system, which outputs to said mass body driving mechanism signals for driving said mass body to compensate for positioning thereof so that said mass body exists within the predetermined stroke range.

2. The device according to claim 1, wherein said position compensation control system includes first modifying means, which accepts input of a compensation operation signal obtained on the basis of driving of said mass body, modifies the signal in accordance with predetermined input/output characteristics, and outputs the modified signal to said mass body driving mechanism.

3. The device according to claim 2, wherein said first modifying means includes a first filter.

4. The device according to claim 3, wherein said first filter selectively outputs from among said compensation operation signals a signal for driving said mass body such that vibration due to motion of said mass body is in a range not exceeding a predetermined range.

5. The device according to claim 3, wherein said first filter selectively outputs from among said compensation operation signals a signal for driving said mass body such that vibration due to motion of said mass body is in a range capable of being eliminated by said anti-vibration mechanism.

6. The device according to claim 3, wherein said first filter selectively outputs from among said compensation operation signals a signal for driving said mass body such that vibration due to motion of said mass body has a vibration frequency capable of being eliminated by said anti-vibration mechanism.

7. The device according to claim 3, wherein said first filter is a low-pass filter.

8. The device according to claim 3, wherein said first filter generates a signal such that a signal outputted thereby is less than a predetermined value.

9. The device according to claim 8, wherein said first filter is a limiter which eliminates signals exceeding a predetermined value.

10. The device according to claim 2, wherein said first modifying means includes switching means for switching input/output characteristics.

11. The device according to claim 10, wherein said switching means switches input/output characteristics according to an operating state of said device.

12. The device according to claim 11, wherein said switching means performs the switching according to positioning precision of said stage.

13. The device according to claim 11, wherein said switching means performs the switching according to a position of said mass body.

14. The device according to claim 2, wherein said position compensation control system includes first generating means, which, based on a feedback signal from said mass body driving mechanism, generates compensation operation signals to be supplied to said first modifying means.

15. The device according to claim 1, wherein said reaction force compensation control system includes second modifying means, which accepts input of a reaction force compensation signal obtained on the basis of a mass body driving reference value and a state of driving said mass body, modifies the signal according to predetermined input/output characteristics, and outputs the signal to said mass body driving mechanism.

16. The device according to claim 15, wherein said second modifying means includes a second filter.

17. The device according to claim 16, wherein said second filter selectively outputs from among the reaction force compensation operation signals a signal for driving said mass body such that vibration produced by driving of said mass body is able to influence vibration produced during motion of said stage.

18. The device according to claim 16, wherein said second filter selectively outputs from among the reaction force compensation operation signals a signal for moving said mass body to produce a reaction force which reduces, of vibration produced by motion of said stage, at least vibration which said anti-vibration mechanism is unable to eliminate.

19. The device according to claim 15, wherein said second modifying means includes switching means for switching input/output characteristics.

20. The device according to claim 19, wherein said switching means switches input/output characteristics according to an operating state of said device.

21. The device according to claim 20, wherein said switching means performs switching according to a precision required in a position of said stage.

22. The device according to claim 20, wherein said switching means performs switching according to a position of said mass body.

23. The device according to claim 15, wherein said reaction force compensation control system includes generating means, which, based on a difference between a reference value and a feedback signal from said mass body driving mechanism, generates the reaction force compensation signal to be supplied to said second modifying means.

24. The device according to claim 1, wherein said stage base is provided with a plurality of said inertia imparting mechanisms for imparting inertia.

25. The device according to claim 24, wherein said inertia imparting mechanism imparts to said stage base a force in a parallel direction and a force in a rotational direction.

26. The device according to claim 24, wherein said position compensation control system compensates for offset in a position of said plurality of mass bodies produced when using said mass bodies to impart to said stage base a force in a rotational direction.

27. The device according to claim 24, wherein at least one pair of said plurality of inertia imparting mechanisms, directions of force produced by moving said mass bodies are parallel.

28. A positioning device comprising:
a stage base having a reference surface;
an anti-vibration mechanism, which supports said stage base and a structure integral with said stage base;
a stage which is movable along said reference surface; and
an inertia imparting mechanism including a mass body which is movable, within a predetermined stroke range, with respect to said stage base, and a mass body driving mechanism for driving said mass body,
wherein said inertia imparting mechanism performs a first operation, which drives said mass body to reduce a reaction force produced by motion of said stage, and a second operation, which drives said mass body to compensate for a positioning offset thereof so that said mass body exists within the predetermined stroke range.

29. The device according to claim 28, wherein moving of said mass body by said second operation is performed in a different frequency band than said first operation.

30. The device according to claim 28, wherein said second operation is performed at the same time as said first operation.

31. The device according to claim 28, wherein said second operation is set so that a frequency of vibration produced by said second operation unit is almost equal to or lower than an effective frequency of said anti-vibration mechanism.

32. An exposure device characterized in that the positioning device according to claim 1 is used to structure at least one of a reticle stage and a wafer stage.

33. The exposure device according to claim 32, wherein said position compensation control system outputs driving signals to said mass body driving mechanism.

34. The exposure device according to claim 32, wherein said reaction force compensation control system is activated at least during exposure.

35. The exposure device according to claim 32, wherein said position compensation control system is inactive during exposure.

36. The exposure device according to claim 32, further comprising a lens-barrel holder, for supporting a projection optical system which projects a reticle pattern onto a wafer, which holder is provided integrally with said stage base.

37. The exposure device according to claim 32, further comprising a lens-barrel holder, for supporting a projection optical system which projects the pattern of a reticle onto a wafer, which holder is supported by an anti-vibration mechanism separate from said anti-vibration mechanism.

38. The exposure device according to claim 32, wherein a reticle pattern is projected onto a wafer by moving a reticle and a wafer relative to a projection optical system, and performing exposure during the movement.

39. The exposure device according to claim 32, wherein said inertia imparting mechanism produces a force in a direction parallel to a direction of motion of said stage during exposure.

40. An exposure device characterized in that the positioning device according to claim 28 is used to structure at least one of a reticle stage and a wafer stage.

41. The exposure device according to claim 40, wherein said second operation is performed during exposure.

42. The exposure device according to claim 40, wherein said first operation is inactive during exposure.

43. A method of producing a device, comprising the steps of:

provided the exposure device according to claim 32; and using the exposure device to project a reticle pattern onto a wafer.

44. The method according to claim 43, further comprising the steps of:

coating a photosensitive agent onto the wafer; and developing the exposed wafer.

45. A positioning method of positioning a positioning device that includes a stage base having a reference surface, an anti-vibration mechanism, which supports the stage base and a structure integral with the stage base, a stage which is movable along the reference surface within a predetermined range and an inertia imparting mechanism including a mass body which is movable with respect to the stage base, and a mass body driving mechanism for driving the mass body, said method comprising the steps of:

a first generating step, in which a signal is generated for driving the mass body so as to reduce a reaction force produced by motion of the stage;

a second generating step, in which a signal is generated for driving the mass body so as to compensate for a position of the mass body so that the mass body exists within the predetermined stroke range; and a step in which the signals generated in the first and second generating steps are applied to the inertia imparting mechanism.

46. A positioning device comprising:

a stage which is movable;

an actuator for moving said stage;

a mass body which is movable within a predetermined stroke range and movement of which cancels a reaction force generated when said actuator moves said stage; and a controller having a reaction force compensation control system and a position compensation control system, said reaction force compensation control system compensating for the reaction force based on a driving signal to said actuator, and said position compensation control system compensating for the position of said mass body so that said mass body exists in the predetermined stroke range.

47. An exposure apparatus comprising:

an exposure unit for exposing a substrate;

a stage which mounts the substrate and is movable;

an actuator which moves said stage;

a mass body which is movable within a predetermined stroke range, and movement of which cancels a reaction force generated when said actuator moves said stage; and a controller having a reaction force compensation control system and a position compensation control system, said reaction force compensation control system compensating for the reaction force based on a driving signal to said actuator, and said position compensation control system compensating for the position of said mass body so that said mass body exists in the predetermined stroke range.

48. A method of producing a device, comprising the steps of:

providing the exposure apparatus according to claim 47; and using said exposure apparatus to project a reticle pattern onto a wafer.

* * * * *

UNITED STATES PATENT AND TRADEMARK OFFICE
CERTIFICATE OF CORRECTION

PATENT NO. : 6,359,679 B1
DATED : March 19, 2002
INVENTOR(S) : Hirohito Ito et al.

It is certified that error appears in the above-identified patent and that said Letters Patent is hereby corrected as shown below:

Title page,
Item [56], References Cited, "6,028,376  2/2000  Osanai" should read
-- 6,028,376  2/2000  Osanai, et al. --.

Column 6,
Line 63, "the-control" should read -- the control --.

Column 7,
Line 33, "rotational torque" should be deleted.
Line 49, "rota-" should be deleted.
Line 50, "tional torque" should be deleted.

Column 11,
Line 46, "flim" should read -- film --.

Signed and Sealed this

Fourth Day of February, 2003

JAMES E. ROGAN
*Director of the United States Patent and Trademark Office*